US010748915B2

(12) United States Patent
Nojima et al.

(10) Patent No.: US 10,748,915 B2
(45) Date of Patent: Aug. 18, 2020

(54) MEMORY DEVICE AND MANUFACTURING METHOD THEREFOR

(71) Applicant: TOSHIBA MEMORY CORPORATION, Minato-ku, Tokyo (JP)

(72) Inventors: Kazuhiro Nojima, Yokkaichi Mie (JP);
Megumi Shibata, Yokkaichi Mie (JP);
Tomonori Kajino, Yokkaichi Mie (JP);
Taro Shiokawa, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/909,568

(22) Filed: Mar. 1, 2018

(65) Prior Publication Data

US 2019/0081053 A1 Mar. 14, 2019

(30) Foreign Application Priority Data

Sep. 14, 2017 (JP) .................................. 2017-177003

(51) Int. Cl.
*H01L 21/66* (2006.01)
*H01L 23/535* (2006.01)
(Continued)

(52) U.S. Cl.
CPC ........ *H01L 27/11556* (2013.01); *G11C 29/00* (2013.01); *G11C 29/025* (2013.01); *G11C 29/1201* (2013.01); *G11C 29/12005* (2013.01); *H01L 22/14* (2013.01); *H01L 22/32* (2013.01); *H01L 23/535* (2013.01); *H01L 27/1157* (2013.01); *H01L 27/11519* (2013.01);
(Continued)

(58) Field of Classification Search
CPC . H01L 2224/32145; H01L 2225/06596; H01L 22/34; H01L 22/14; H01L 29/78; H01L 27/11556; H01L 27/11519; H01L 27/11524; H01L 27/11565; H01L 22/32; H01L 23/535; H01L 27/1157; G01R 31/2818; G01R 31/2621; G01R 31/2625; G11C 16/0483
See application file for complete search history.

(56) References Cited

U.S. PATENT DOCUMENTS 6,509,197 B1 1/2003 Satya et al.
6,807,109 B2 10/2004 Tomishima
(Continued)

FOREIGN PATENT DOCUMENTS

JP 3515328 B2 4/2004
JP 2008-311439 A 12/2008
(Continued)

*Primary Examiner* — Amar Movva
(74) *Attorney, Agent, or Firm* — Foley & Lardner LLP

(57) ABSTRACT

According to one embodiment, there is provided a memory device which includes a plurality of elements that include three-dimensionally arranged memory cells, a transistor that is electrically connected to at least one of the plurality of elements, an inspection pad that is connected in series to at least one of the plurality of elements through the transistor, and a wiring that is electrically connected to the inspection pad and a gate of the transistor and capable of supplying a common potential to both the inspection pad and the transistor for turning the transistor to an OFF state.

15 Claims, 17 Drawing Sheets

(51) Int. Cl.
  H01L 27/1157 (2017.01)
  H01L 27/11573 (2017.01)
  G11C 29/00 (2006.01)
  G11C 29/12 (2006.01)
  H01L 27/11575 (2017.01)
  G11C 29/02 (2006.01)
  G11C 16/04 (2006.01)
  H01L 27/11556 (2017.01)
  H01L 27/11519 (2017.01)
  H01L 27/11524 (2017.01)
  H01L 27/11565 (2017.01)
  H01L 27/11582 (2017.01)

(52) U.S. Cl.
  CPC .. *H01L 27/11524* (2013.01); *H01L 27/11565* (2013.01); *H01L 27/11573* (2013.01); *H01L 27/11575* (2013.01); *H01L 27/11582* (2013.01); *G11C 16/0483* (2013.01); *G11C 2029/1202* (2013.01); *G11C 2029/1204* (2013.01); *G11C 2029/1206* (2013.01)

(56) References Cited

U.S. PATENT DOCUMENTS

| | | | |
|---|---|---|---|
| 7,724,011 | B2 | 5/2010 | Matsumoto |
| 8,178,917 | B2 | 5/2012 | Tanaka et al. |
| 9,214,469 | B2 | 12/2015 | Yamauchi |
| 10,079,187 | B2 * | 9/2018 | Beckmeier ......... G01R 31/2818 |
| 2006/0267221 | A1 * | 11/2006 | Allen ..................... H01L 22/22 |
| | | | 257/786 |
| 2010/0060292 | A1 * | 3/2010 | De Vries ............ G01R 31/2884 |
| | | | 324/537 |
| 2011/0284946 | A1 * | 11/2011 | Kiyotoshi ......... H01L 27/11565 |
| | | | 257/324 |
| 2012/0049148 | A1 | 3/2012 | Fukano |
| 2016/0071872 | A1 | 3/2016 | Saito et al. |

FOREIGN PATENT DOCUMENTS

| | | |
|---|---|---|
| JP | 4507091 B2 | 7/2010 |
| TW | 201331942 A | 8/2013 |

* cited by examiner

MEMORY DEVICE AND MANUFACTURING METHOD THEREFOR

CROSS-REFERENCE TO RELATED APPLICATION

This application claims the benefit of and priority to Japanese Patent Application No. 2017-177003, filed Sep. 14, 2017, the entire contents of which are incorporated herein by reference.

FIELD

Embodiments described herein relate generally to a memory device and a manufacturing method therefor.

BACKGROUND

Development of a memory device including three-dimensionally arranged memory cells has been advanced. For example, a NAND flash memory device includes a plurality of word lines stacked on a source layer and a semiconductor channel penetrating and extending through the plurality of word lines. Each memory cell is disposed at a portion where each word line and the semiconductor channel intersect each other. In such a memory device, it is difficult to detect structural defect in a stacked body due to variations in manufacturing conditions. Improvements in detecting structural defect in a stacked body remain desired.

DETAILED DESCRIPTION

Figure 1:
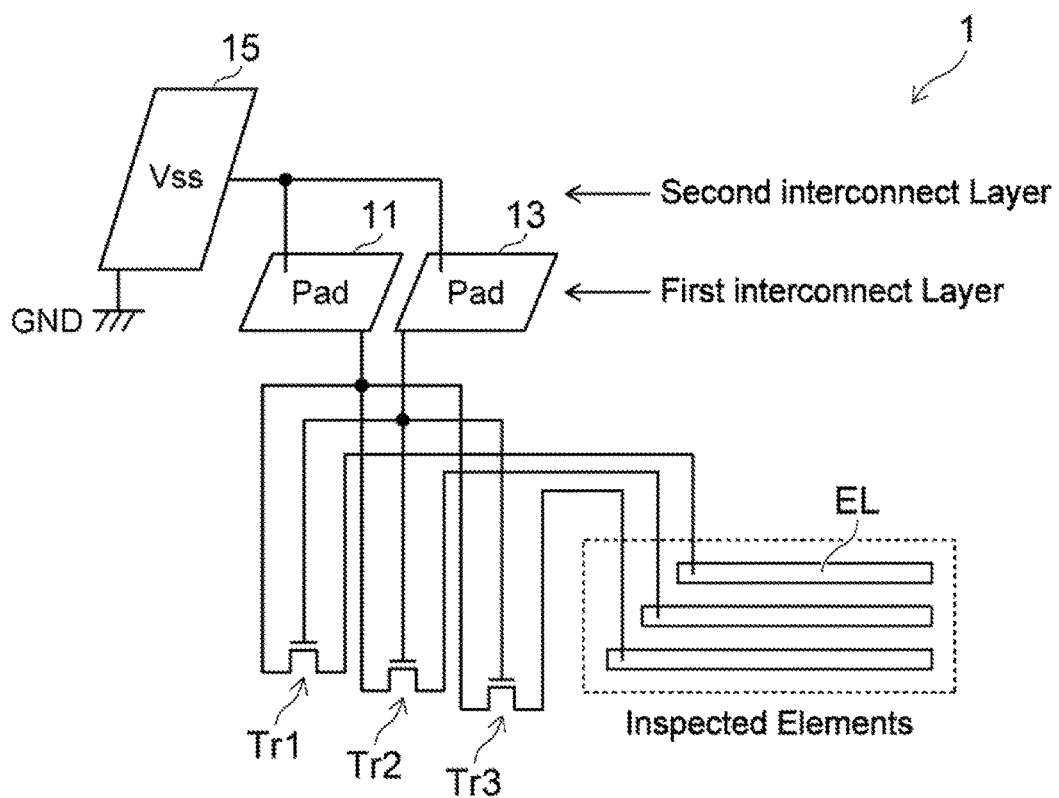
FIG. 1 is a schematic diagram illustrating a memory device according to a first embodiment.

To detect structural defect in a stacked body in a memory device including three-dimensionally arranged memory cells, a manufacturing process of the memory device may include an in-line inspection in which structural defect can be detected in real time and the structural defect can be fed back for the manufacturing conditions.

An exemplary embodiment provides a memory device capable of detecting structural defect by in-line inspection.

In general, according to some embodiments, a memory device may include a plurality of elements that include three-dimensionally arranged memory cells, a transistor that is electrically connected to at least one of the plurality of elements, an inspection pad that is electrically connected in series to at least one of the plurality of elements through the transistor, and a wiring that is electrically connected to the inspection pad and a gate of the transistor and capable of supplying a common potential to both the inspection pad and the transistor for turning the transistor to an OFF state.

Hereinafter, embodiments will be described with reference to the drawings. The same portions in the drawings are assigned the same reference numerals and detailed description thereof may be appropriately omitted, and description will be made on different portions. The drawings are schematic or conceptual ones, and a relationship between a thickness and a width of each portion, a ratio of sizes between the portions and the like are not necessarily the same as actual ones. Also, even in a case of representing the same portions, dimensions and ratios of the portions may be represented differently from each other depending on the drawing.

Furthermore, an arrangement and configuration of each portion will be described using the X-axis, the Y-axis and the Z-axis illustrated in each drawing. The X-axis, the Y-axis, and the Z-axis are orthogonal to each other and represent the X-direction, the Y-direction, and the Z-direction, respectively. Further, description may be made by describing the Z-direction as upward and the opposite direction thereof as downward.

FIG. 1 is a schematic diagram illustrating a memory device 1 according to a first embodiment. The memory device 1 may be, for example, a NAND flash memory device and may include a plurality of three-dimensionally arranged memory cells.

As illustrated in FIG. 1, the memory device 1 includes a plurality of elements EL, transistors Tr1 to Tr3, an inspection pad 11, a gate pad 13, and a wiring Vss 15. The element EL is, for example, a circuit for driving a memory cell, a word line WL, a bit line BL, and the like. The inspection pad 11 is connected in series to each of the plurality of elements EL through the transistors Tr1 to Tr3. The gate pad 13 is electrically connected to each of gates of the transistors Tr1 to Tr3. The inspection pad 11 and the gate pad 13 are used for in-line inspection, for example, and have an area capable of allowing contact of an inspection probe (not shown).

In this example, the plurality of elements EL are connected in parallel to the inspection pad 11 through the transistors Tr1 to Tr3, but the embodiment is not limited to this example, and at least one element EL may be connected to the inspection pad 11.

For example, the inspection pad 11 and the gate pad 13 are provided in a first wiring layer located higher than the plurality of elements EL and transistors Tr1 to Tr3. The wiring Vss is provided in a second wiring layer that is a higher layer than the first wiring layer. The wiring Vss is electrically connected to the inspection pad 11 and the gate pad 13 and supplies a common potential to both the inspection pad 11 and the gate pad 13. For example, the wiring Vss is connected to a substrate (not shown) and supplies a ground (GND) potential to the inspection pad 11 and the gate pad 13. The elements EL and the transistors Tr1 to Tr3 are provided on the substrate.

For example, the transistors Tr1 to Tr3 may be N-channel MOS (NMOS) transistors having a positive threshold voltage Vth, and the inspection pad 11 may be electrically connected to a source of each transistor Tr. As a result, the GND potential can be supplied to the sources and the gates of the transistors Tr1 to Tr3, and the transistors Tr1 to Tr3 can be turned to an OFF state. With this, the elements EL can be electrically separated.

Figure 2:
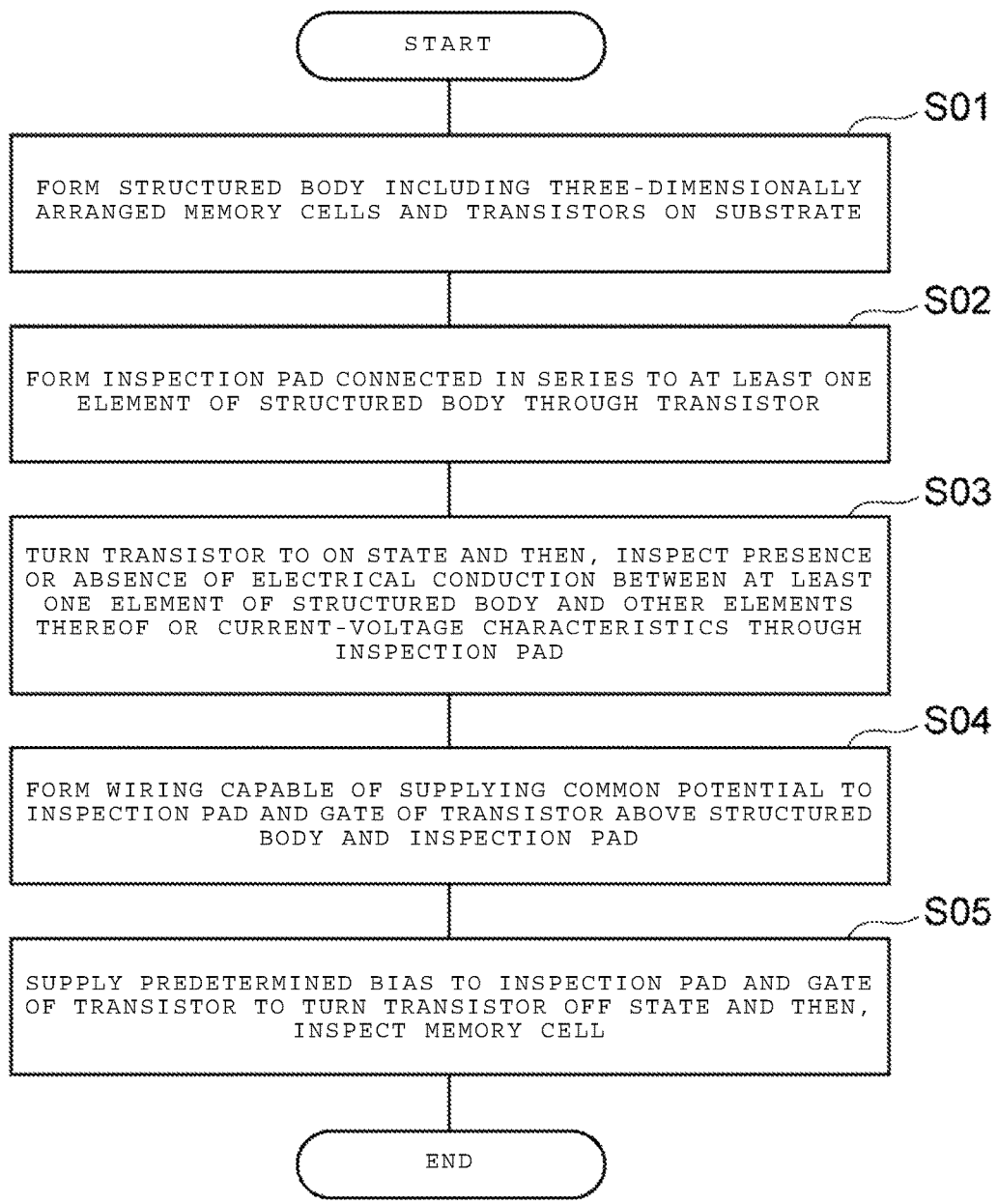
FIG. 2 is a flowchart illustrating a manufacturing method of the memory device according to the first embodiment.
Figure 3:
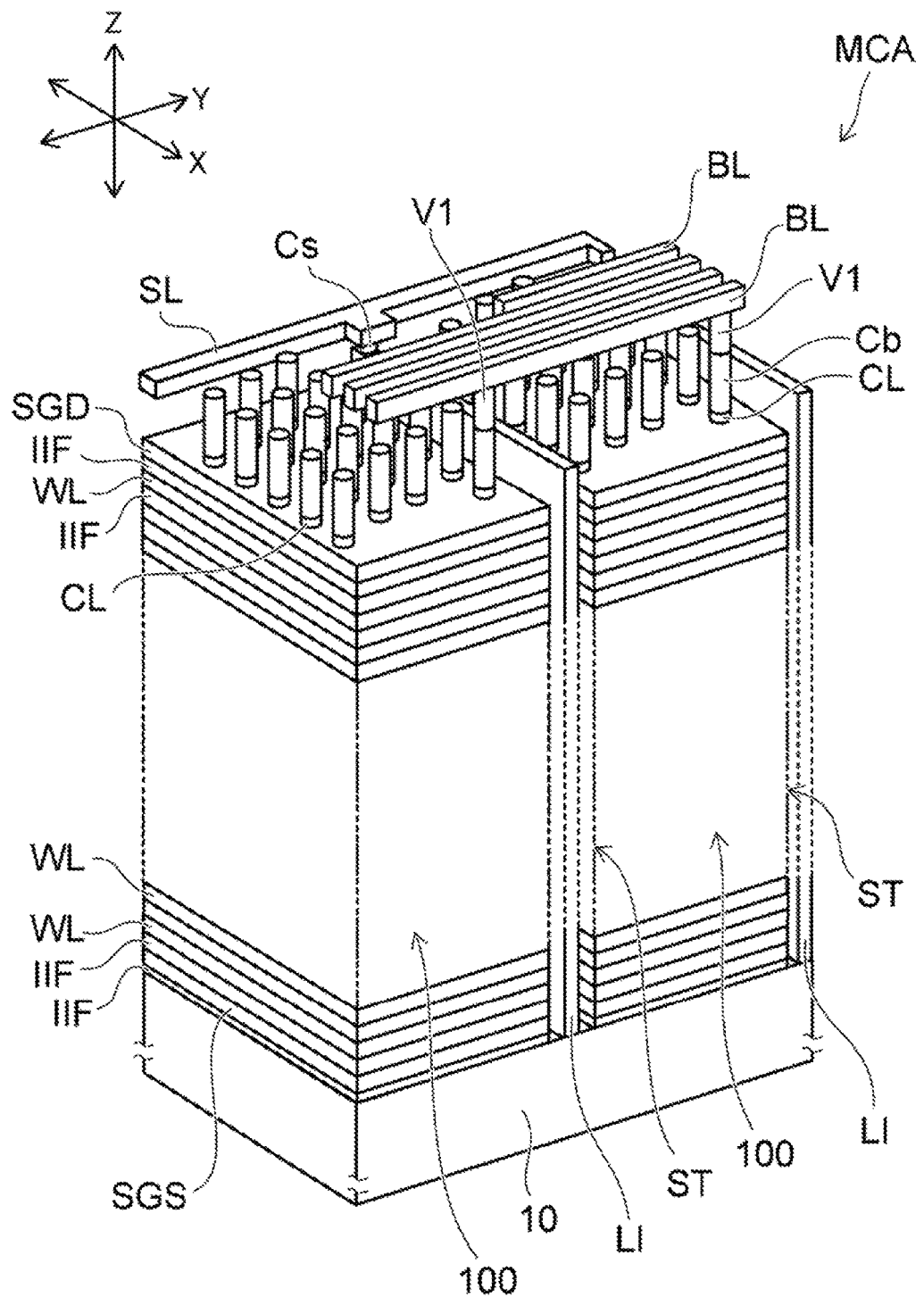
FIG. 3 is a schematic diagram illustrating a memory cell array of the memory device according to a first embodiment.
Figure 4:
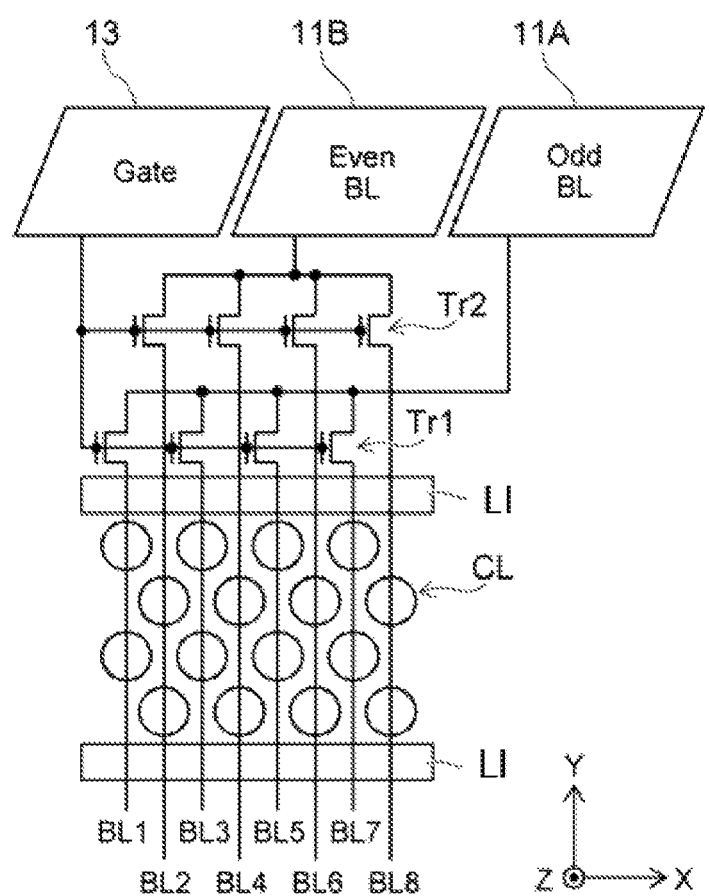
FIG. 4 is a schematic diagram illustrating a first configuration of the memory device according to the first embodiment.

Next, a manufacturing method of the memory device 1 will be described with reference to FIG. 2, FIG. 3, and FIG. 4. FIG. 2 is a flowchart illustrating a manufacturing process of the memory device 1. FIG. 3 is a perspective view schematically illustrating a memory cell array MCA of the memory device 1. In FIG. 3, a portion of the insulating film that electrically insulates the elements from each other is omitted. FIG. 4 is a schematic diagram illustrating the configuration of the memory device 1 at the time of in-line inspection.

In Step S01 (see FIG. 2), the memory cell array MCA (see FIG. 3) including three-dimensionally arranged memory cells and the transistors Tr1 to Tr3 may be formed on the substrate. The transistors Tr1 to Tr3 may be provided around, for example, the memory cell array MCA.

As illustrated in FIG. 3, the memory cell array MCA includes a stacked body 100 provided on a source layer 10. The source layer 10 may be a portion of a substrate or a conductive layer (see FIG. 16A and FIG. 16B, and FIG. 17A and FIG. 17B) provided on the substrate. The stacked body 100 includes a selection gate SGS, a word line WL, and a selection gate SGD. The selection gate SGS, the word line WL, and the selection gate SGD are stacked on the source layer 10 with an interlayer insulating film IIF interposed therebetween.

As illustrated in FIG. 3, the memory cell array MCA further includes a columnar body CL, a bit line BL, a source line SL, and a source contact LI. The columnar body CL penetrates and extends through the stacked body 100 in the Z-direction. The bit line BL extends, for example, in the Y-direction above the stacked body 100. The bit line BL may be electrically connected to the columnar body CL through contact plugs Cb and V1. A memory cell may be provided in a portion where the columnar body CL intersects with the word line WL.

As illustrated in FIG. 3, the selection gate SGS, the word line WL, and the selection gate SGD are divided by a slit ST, and the plurality of stacked bodies 100 are disposed on the source layer 10. Furthermore, the source contact LI is provided inside the slit ST. The source contact LI electrically connects the source layer 10 and the source line SL. The source line SL is connected to the source contact LI through a contact plug Cs, and the source contact LI is connected to the source layer 10.

In Step S02 (see FIG. 2), an inspection pad 11 (see FIG. 1) connected in series to at least one element of the memory cell array MCA through the transistor Tr (Tr is either Tr1 or Tr2 or Tr3; see FIG. 1) is formed. The inspection pad 11 is provided, for example, in a wiring layer that is a higher layer than the bit line BL.

As illustrated in FIG. 4, inspection pads 11A and 11B and a gate pad 13 are provided. The inspection pad 11A is connected in series to odd-numbered bit lines (e.g., BL1, BL3, BL5, and BL7) through the transistor Tr1. The inspection pad 11B is connected in series to even-numbered bit lines (e.g., BL2, BL4, BL6 and BL8) through the transistor Tr2. That is, the inspection pads 11A and 11B are electrically connected to every other bit line BL among the bit lines BL aligned in the X-direction. The gate pad 13 is electrically connected to each of the gates of the transistors Tr1 and Tr2.

In Step S03 (see FIG. 2), inline inspection is performed. For example, a probe (not shown) is brought into contact with the inspection pads 11A and 11B and the gate pad 13, and predetermined gate bias for turning the transistors Tr1 and Tr2 ON is supplied to the gate pad 13. Subsequently, a voltage may be applied between the inspection pad 11A and the inspection pad 11B, and a current flowing between the inspection pad 11A and the inspection pad 11B may be detected to thereby inspect the presence or absence of contact between the odd-numbered bit line BL and the even-numbered bit line BL. Otherwise, a voltage may be applied between the inspection pad 11A and the inspection pad 11B to acquire current-voltage characteristics such as a resistance value, a capacitance value, a transistor characteristic curve (IdVg) or the like. With this, it is possible to determine whether the bit line BL is appropriately formed or not.

In Step S04 (see FIG. 2), a wiring layer including the wiring Vss is formed above the inspection pad 11. The wiring Vss is electrically connected to the inspection pad 11 and the gate pad 13 and is formed so as to supply common bias to both the inspection pad 11 and the gate pad 13 (see FIG. 1).

In Step S05 (see FIG. 2), a predetermined bias is supplied to the inspection pad 11 and the gate pad 13 through the wiring Vss to turn the transistor Tr to OFF state. With this, the bit lines BL are separated from the inspection pads 11A and 11B and controlled independently of each other. Thereafter, a predetermined bias may be supplied to each bit line BL and word line WL to test an operation of the memory cell.

Figure 5:
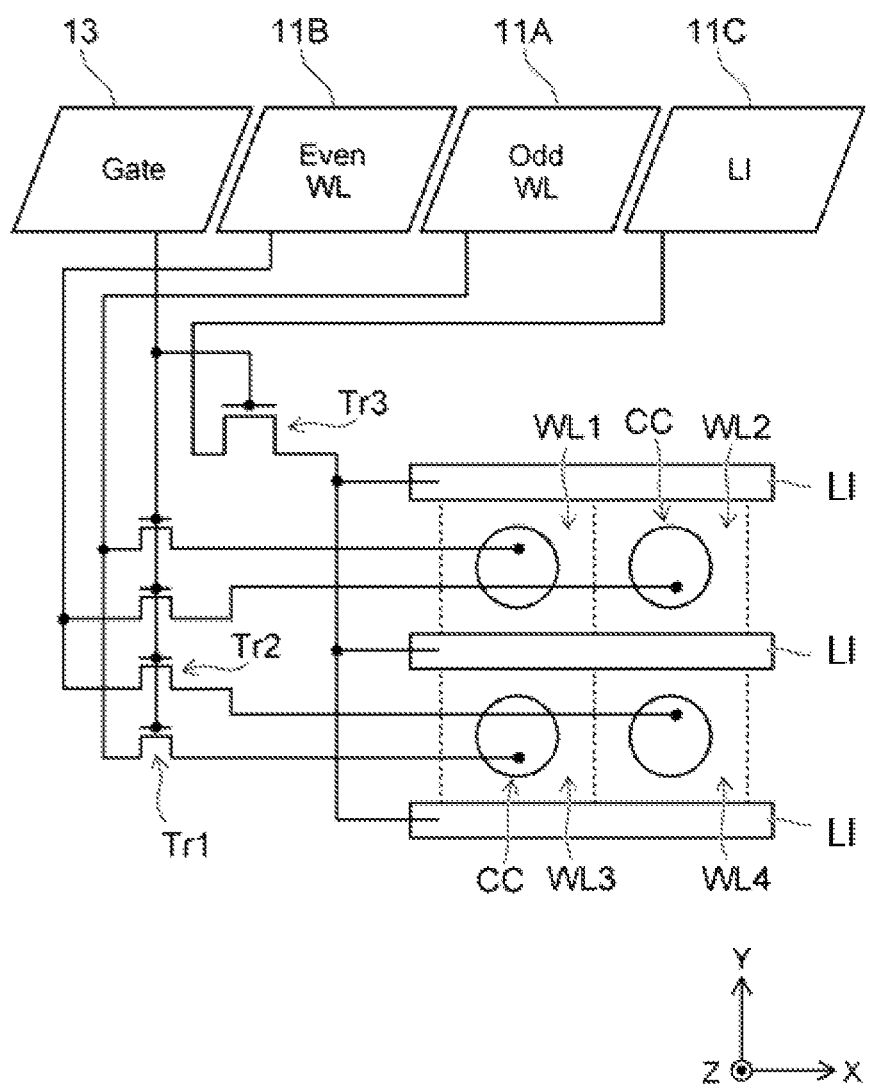
FIG. 5 is a schematic diagram illustrating a second configuration of the memory device according to the first embodiment.

FIG. 5 is a schematic diagram illustrating another configuration of the memory device 1 at the time of in-line inspection. In this example, the inspection pads 11A, 11B, 11C and the gate pad 13 are provided above the memory cell array MCA.

The inspection pad 11A is electrically connected to the odd-numbered word lines (e.g., WL1 and WL3) through the transistor Tr1 and a contact plug CC. The inspection pad 11B is electrically connected in series to the even-numbered word lines (e.g., WL2 and WL4) through the transistor Tr2 and the contact plug CC. The inspection pad 11C is connected in series to the source contact LI through the transistor Tr3. The gate pad 13 is electrically connected to each of the gates of the transistors Tr1, Tr2 and Tr3.

In the in-line inspection, for example, the probe is brought into contact with the inspection pads 11A and 11B and the gate pad 13, and a predetermined gate bias for turning the transistors Tr1, Tr2 and Tr3 ON may be supplied to the gate pad 13. Subsequently, a voltage may be applied between the inspection pad 11A and the inspection pad 11B, between the inspection pad 11B and the inspection pad 11C, and between the inspection pad 11C and the inspection pad 11A to detect the current flowing between the inspection pads 11A and 11B, between the inspection pads 11B and 11C, and the inspection pads 11C and 11A, respectively. With this, the presence or absence of contact between the odd-numbered word line WL and the even-numbered word line WL, the presence or absence of contact between the even-numbered word line WL and the source contact LI, and the presence or absence of contact between the source contact LI and the odd-numbered word line WL can be inspected. As a result, it is possible to determine whether the word line WL and the source contact LI are appropriately formed or not.

FIG. 6A, FIG. 6B, FIG. 7 and FIG. 8 are schematic diagrams illustrating another configuration of the memory device 1 at the time of in-line inspection. In this example, as the transistor Tr (Tr is either Tr 1 or Tr 2 or Tr3), a memory cell transistor or a selection gate transistor located inside the memory cell array MCA, or both the memory cell transistor and the selection gate transistor may be used.

Figure 6A:
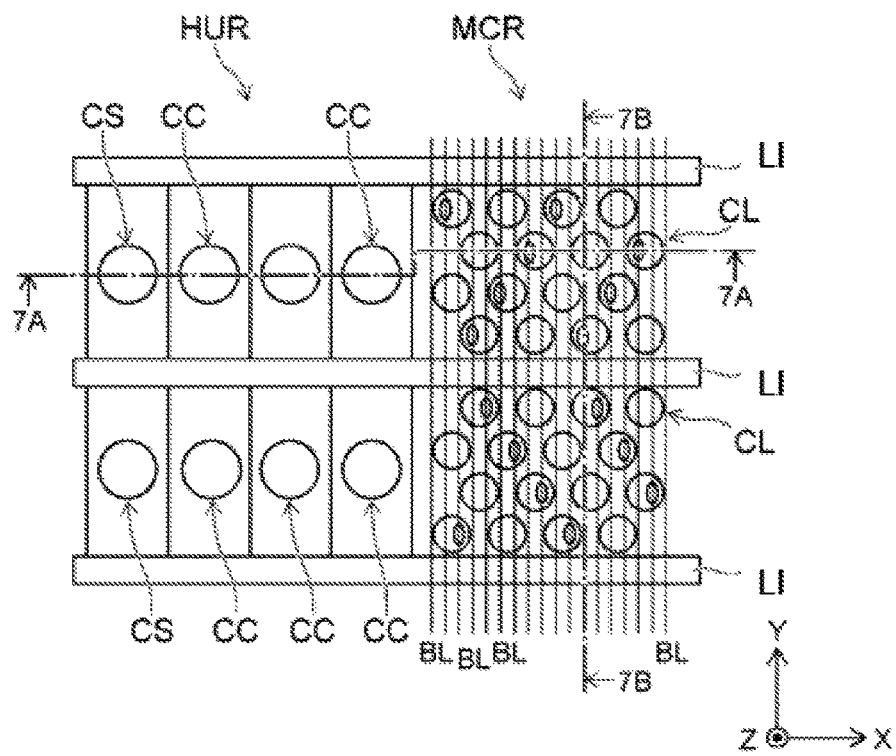
FIG. 6A and FIG. 6B are schematic plan views illustrating a third configuration of the memory device according to the first embodiment.

FIG. 6A is a schematic plan view illustrating a hook-up region HUR located at the end of the memory cell array MCA and a memory cell region MCR. In the hook-up region HUR, end portions of the selection gate SGS, the word line WL, and the selection gate SGD stacked in the Z-direction are formed in a step shape (see FIG. 7A), and the contact plug CC connected each of the word line WL and the selection gates SGD and SGS is provided. In the memory cell region MCR, the bit line BL is connected to the columnar body CL.

Figure 6B:
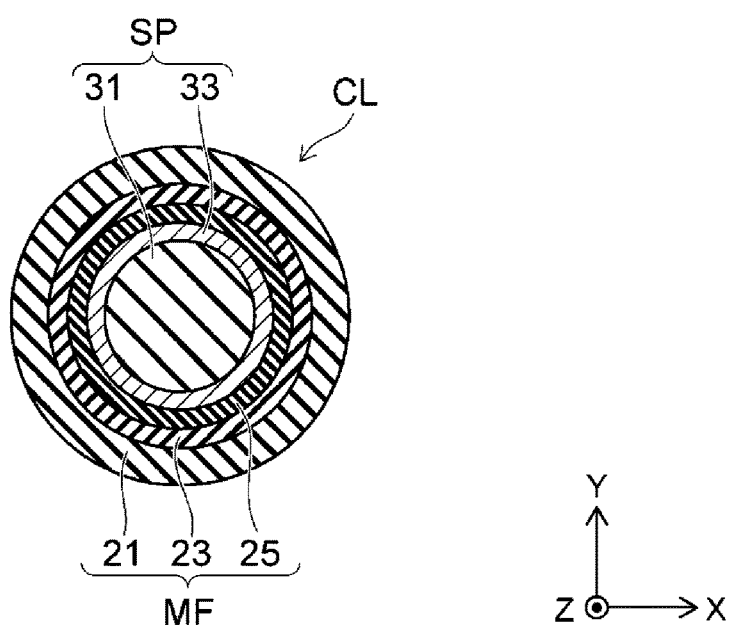

FIG. 6B is a schematic cross-sectional view illustrating a structure of the columnar body CL. The columnar body CL includes a semiconductor pillar SP and a memory film MF. The memory film MF is provided so as to surround side surfaces of the semiconductor pillar SP. The semiconductor pillar SP includes, for example, an insulating core 31 and a semiconductor layer 33 extending in the Z-direction. The semiconductor layer 33 is located between the insulating core 31 and the memory film MF and extends along the insulating core 31 in the Z-direction. The bit line BL (see FIG. 6A) may be electrically connected to the semiconductor layer 33.

As illustrated in FIG. 6B, the memory film MF has a stacked structure including, for example, a block insulating film 21, a charge holding film 23, and a tunnel insulating film 25. The block insulating film 21 and the tunnel insulating film 25 are, for example, silicon oxide films, and the charge holding film 23 is, for example, a silicon nitride film.

Figure 7A:
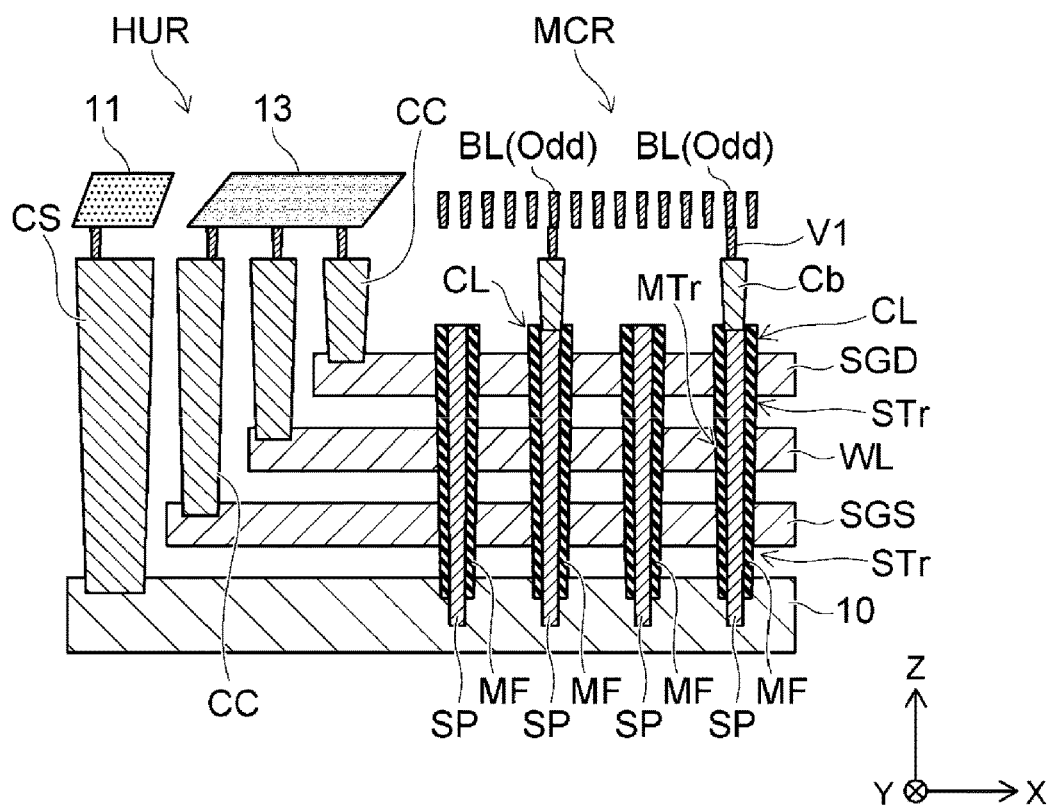
FIG. 7A and FIG. 7B are schematic cross-sectional views illustrating the third configuration of the memory device according to the first embodiment.

FIG. 7A is a schematic diagram illustrating a cross section taken along line 7A-7A in FIG. 6A. In this example, the inspection pad 11 is electrically connected to the contact plug CS connected to the source layer 10. The gate pad 13 is electrically connected to all contact plugs CC connected respectively to the selection gate SGS, the word line WL, and the selection gate SGD.

As illustrated in FIG. 7A, the semiconductor pillar SP is connected to the source layer 10 at its lower end. The semiconductor pillar SP may be electrically connected to one of the bit lines BL at its upper end.

For example, a memory cell transistor MTr is formed at a portion where the word line WL and the columnar body CL intersect with each other. The word line WL may function as a gate of the memory cell transistor MTr, and the semiconductor pillar SP may function as a channel of the memory cell transistor MTr. The memory film MF may function as a gate insulating film of the memory cell transistor MTr.

Selection transistors STr are formed at portions where the selection gates SGS and SGD intersect the columnar body CL, respectively. The selection gates SGS and SGD may function as gates of the selection transistor STr, respectively, and the semiconductor pillar SP may function as a channel of the selection transistor STr. The memory film MF may function as a gate insulating film of the selection transistor STr.

The inspection pad 11 is electrically connected to the semiconductor pillar SP through the contact plug CS and the source layer 10. Furthermore, the inspection pad 11 is electrically connected to the bit line BL through the semiconductor pillar SP. Accordingly, it is possible to control electrical conduction between the inspection pad 11 and the bit line BL by supplying a predetermined bias to the gate pad 13 and turning the memory cell transistor MTr and the selection transistor STr ON/OFF. In this example, one inspection pad 11 is electrically connected to the odd-numbered or even-numbered bit line BL among the plurality of bit lines BL through the semiconductor pillar SP.

Figure 7B:
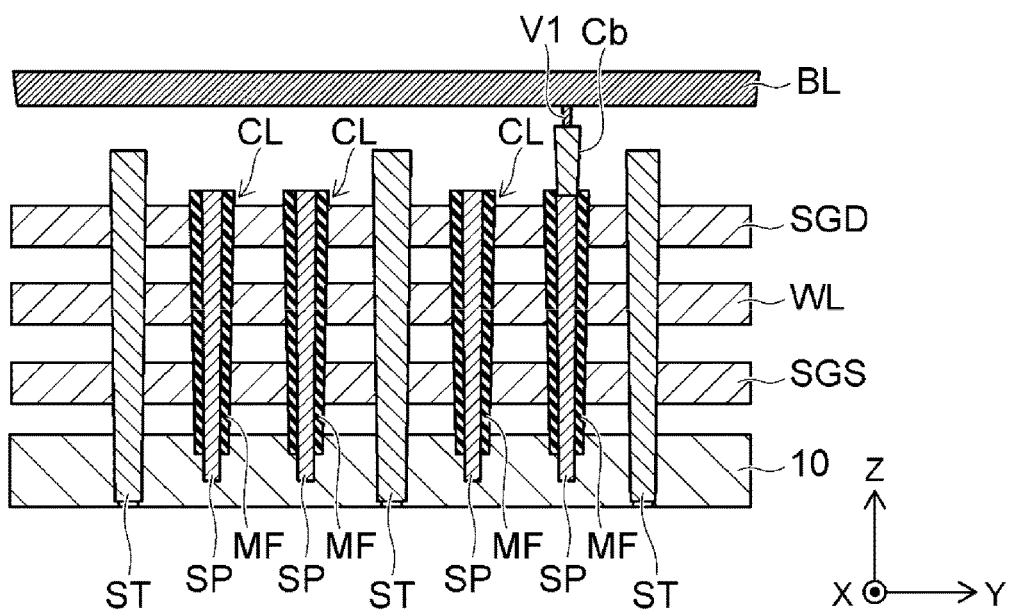

FIG. 7B is a schematic diagram illustrating a cross section taken along line 7B-7B in FIG. 6A. As illustrated in FIG. 7B, the source layer 10 is divided into a plurality of portions by the slit ST, and the plurality of portions are insulated from each other by an insulating film provided inside the slit ST.

For example, in a case where the inspection pad 11 electrically connected to one divided portion of the source layer 10 is electrically connected to the even-numbered bit line BL (Even), another inspection pad 11 electrically connected to another portion of the source layer 10 may be provided so as to be electrically connected to the odd-numbered bit line BL (Odd).

As described above, in the first embodiment, electrical connection between the inspection pad 11 and the bit line BL, which is connected to a target to be inspected, is subjected to ON/OFF control by using the memory cell transistor MTr and the selection transistor STr located in the memory cell array MCA instead of the transistors Tr1 to Tr3 provided around the memory cell array MCA.

FIG. 8A to FIG. 8D are schematic diagrams illustrating regions IA1 to IA3 where the selection transistors STr and the memory cell transistor MTr capable of being used for in-line inspection are disposed. The selection transistor STr and the memory cell transistor MTr are connected in series between the bit line BL and the inspection pad 11 (see FIG. 7A), and it becomes possible to electrically inspect connection between the bit lines BL through the inspection pad 11. As a result, it is possible to determine whether the bit line BL is appropriately formed or not. In each figure, two memory cell arrays MCA, sense amplifiers (SA), and row decoders RD controlling each memory cell array are illustrated.

Figure 8A:
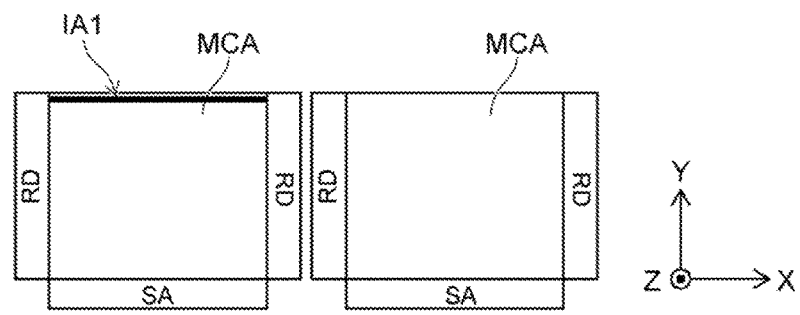
FIG. 8A to FIG. 8D are schematic diagrams illustrating the third configuration of the memory device according to the first embodiment.

For example, as illustrated in FIG. 8A, the inspection pad may be connected to the target to be inspected by using the selection transistor STr and the memory cell transistor MTr provided in the region IA1 located at an upper end of one memory cell array MCA.

Figure 8B:
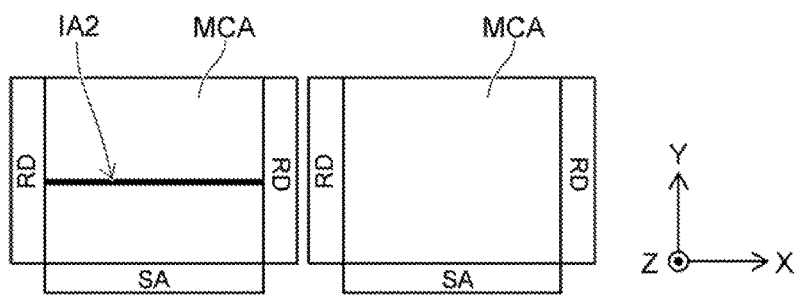

As illustrated in FIG. 8B, in some embodiments, the selection transistor STr and the memory cell transistor MTr provided in the region IA2 located at the center of the memory cell array MCA may be used.

Figure 8C:
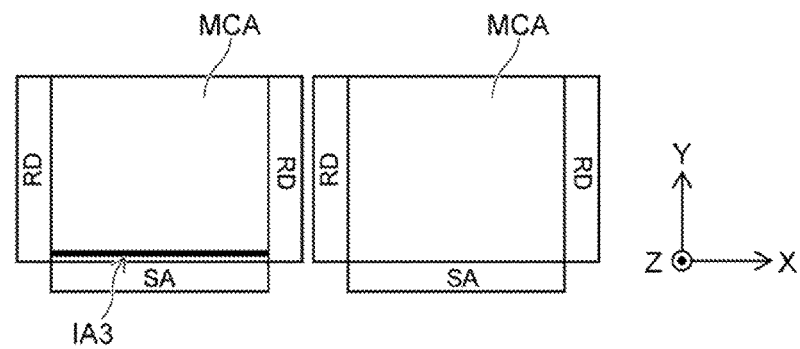

As illustrated in FIG. 8C, in some embodiments, the selection transistor STr and the memory cell transistor MTr provided in the region IA3 located at the lower end of the memory cell array MCA can also be used.

Figure 8D:
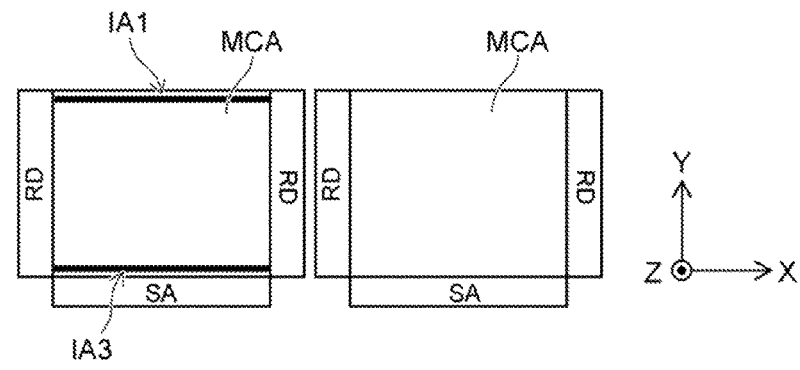

As illustrated in FIG. 8D, for example, the selection transistor STr and the memory cell transistor MTr of the region IA1 located at the upper end are connected to the odd-numbered bit line BL, the selection transistor STr and the memory cell transistor MTr of the region IA3 located at the lower end are connected to the even-numbered bit line BL so as to make it possible to inspect insulation between the even-numbered bit line BL and the odd-numbered bit line BL.

In the first embodiment, it is possible to perform in-line inspection on each element EL of the memory cell array MCA by using the inspection pad 11 provided above the memory cell array MCA. With this, propriety of forming condition of each element EL is fed back to each manufacturing process to thereby make it possible to improve manufacturing yield of the memory device 1. Furthermore, in a process after in-line inspection, the wiring Vss capable of supplying a common potential to the inspection pad 11 and the gate pad 13 is provided. With this, at the time of using the memory device 1, it is possible to turn the transistor Tr interposed between the inspection pad 11 and each element EL to the OFF state to electrically separate the inspection pad 11 and each element EL.

Figure 9:
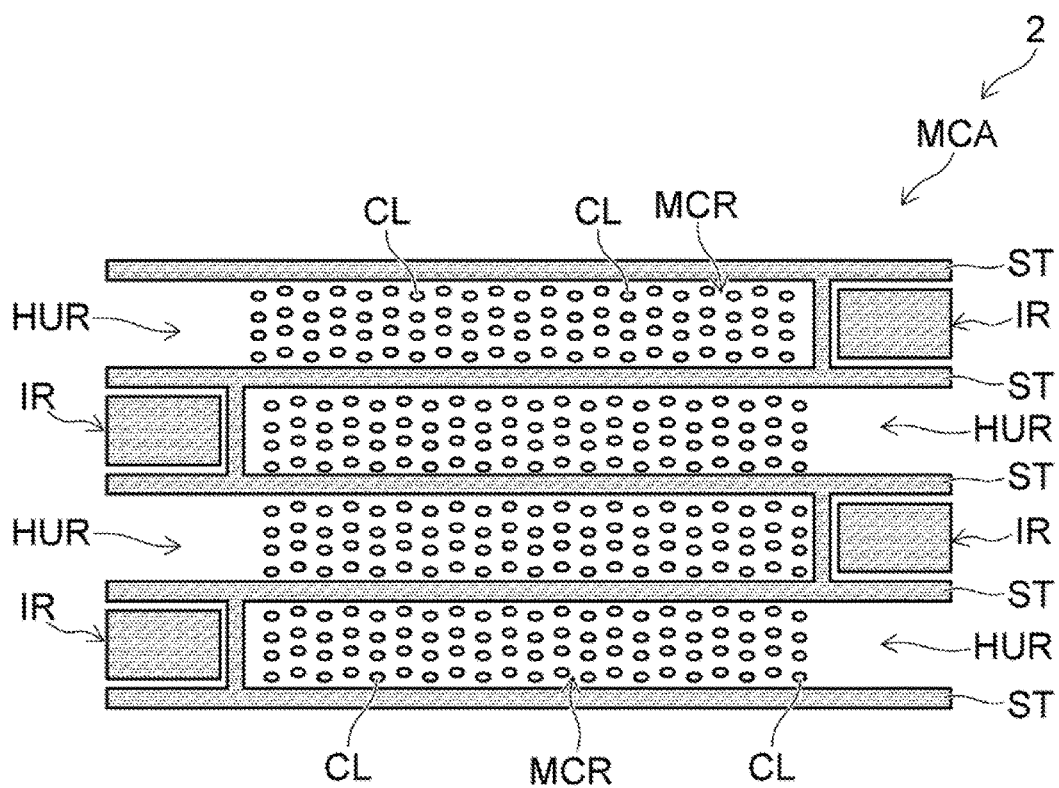
FIG. 9 is a schematic plan view illustrating a memory device according to a second embodiment.

FIG. 9 is a schematic plan view illustrating the memory cell array MCA of a memory device 2 according to a second embodiment. The memory device 2 includes the memory cell region MCR, the hook-up region HUR, and an inspection region IR.

In the memory cell region MCR, the plurality of columnar bodies CL are provided and memory cells may be formed at portions where the columnar bodies CL intersect the word lines WL (see FIG. 1). In the hook-up region HUR, the contact plugs CC (e.g., CC1-CC10 in FIG. 10A) connected respectively to the plurality of word lines WL stacked in the Z-direction may be disposed (see FIG. 10A).

The inspection region IR is separated from the memory cell region MCR by the slit ST and is used for in-line inspection of the contact plug CC.

Figure 10A:
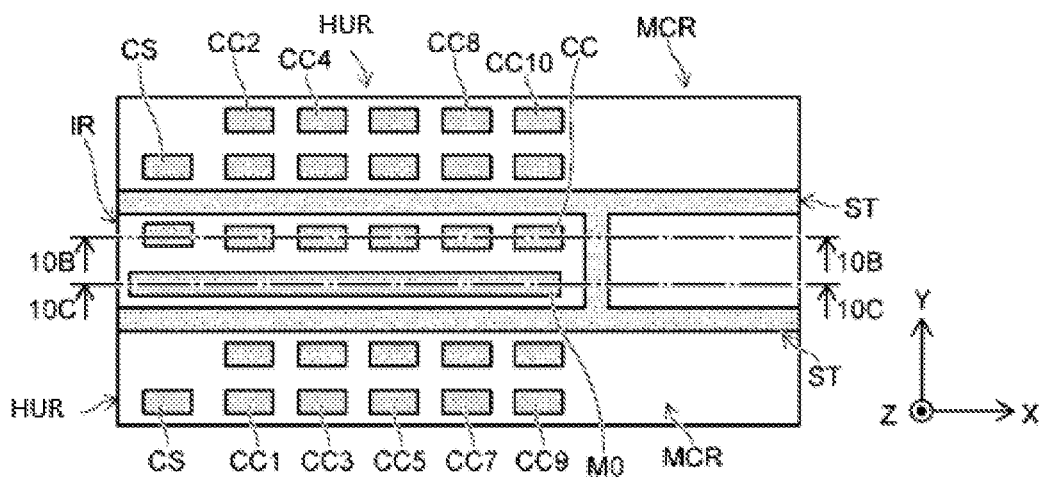
FIG. 10A to FIG. 10C are schematic diagrams illustrating a structure of the memory device according to the second embodiment.
Figure 10B:
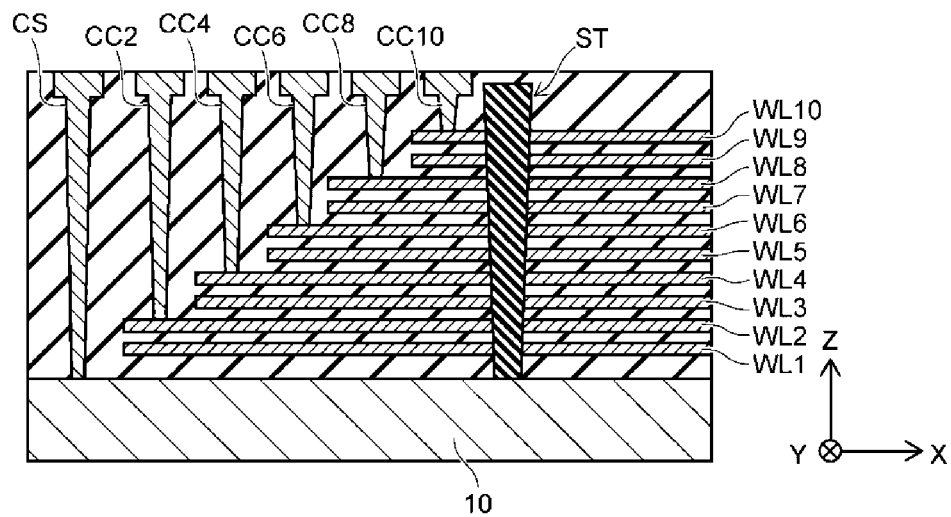
Figure 10C:
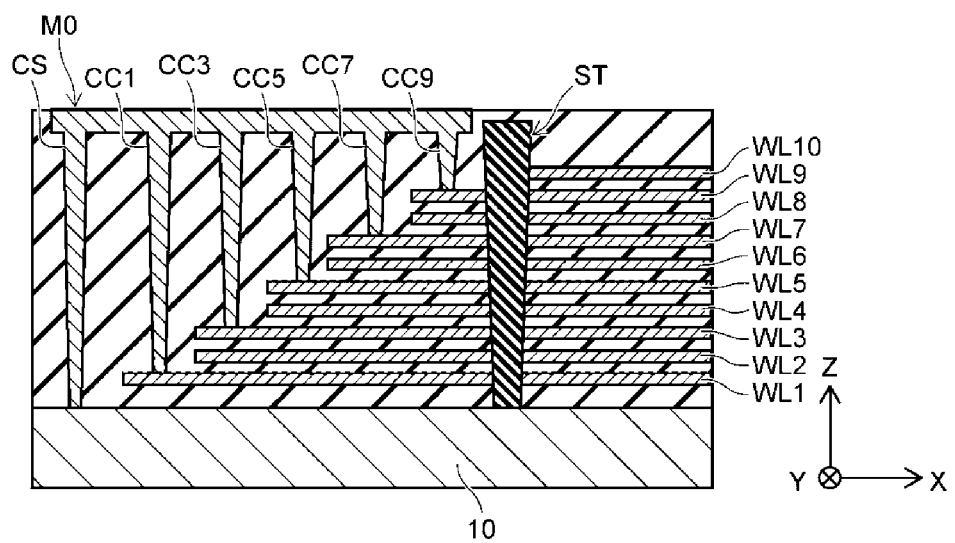

FIG. 10A, FIG. 10B and FIG. 10C are schematic diagrams illustrating the structure of the inspection region IR. FIG. 10A is a schematic diagram illustrating the top surface of the memory cell array MCA. FIG. 10B is a cross-sectional view taken along line 10B-10B illustrated in FIG. 10A. FIG. 10C is a cross-sectional view taken along line 10C-10C illustrated in FIG. 10A.

As illustrated in FIG. 10A, the contact plugs CC and CS are disposed in the hook-up region HUR and the inspection region IR. In the inspection region IR, a wiring M0 is further provided.

As illustrated in FIG. 10B and FIG. 10C, the contact plug CS is connected to the source layer 10. The end portions of the plurality of word lines WL are provided in a step shape and the contact plug CC is connected to each word line WL.

As illustrated in FIG. 10B, contact plugs CC2, CC4, CC6, CC8 and CC10 are connected to word lines WL2, WL4, WL6, WL8 and WL10, respectively. The word line WL provided in the inspection region IR is divided by the slit ST and thus, the word lines WL2 to WL10 illustrated in FIG. 10B are different from the word lines WL2 to WL10 illustrated in FIG. 10C, but description will be made by using the same reference numerals for convenience. The same applies in the following.

As illustrated in FIG. 10C, contact plugs CC1, CC3, CC5, CC7 and CC9 are connected to word lines WL1, WL3, WL5, WL7 and WL9, respectively.

Furthermore, in the inspection region IR, the wiring M0 (see FIG. 10A) connecting the contact plugs CS, CC1, CC3, CC5, CC7 and CC9 is provided. With this, the word lines WL1, WL3, WL5, WL7 and WL9 are electrically connected to the source layer 10.

Figure 11A:
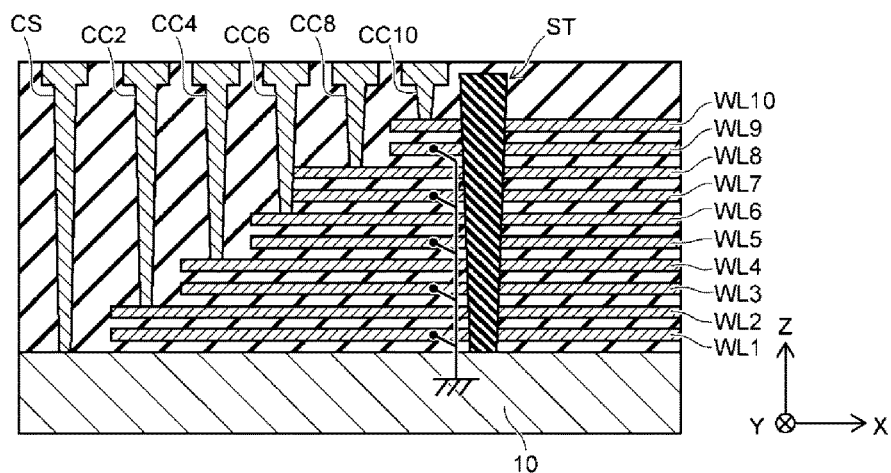
FIG. 11A to FIG. 11D are schematic diagrams illustrating an inspection method of the memory device according to the second embodiment.
Figure 11B:
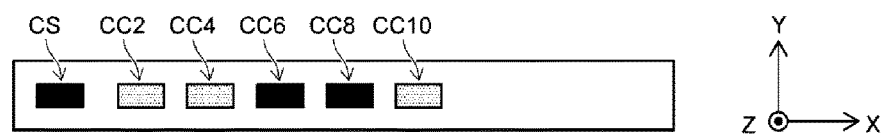
Figure 11C:
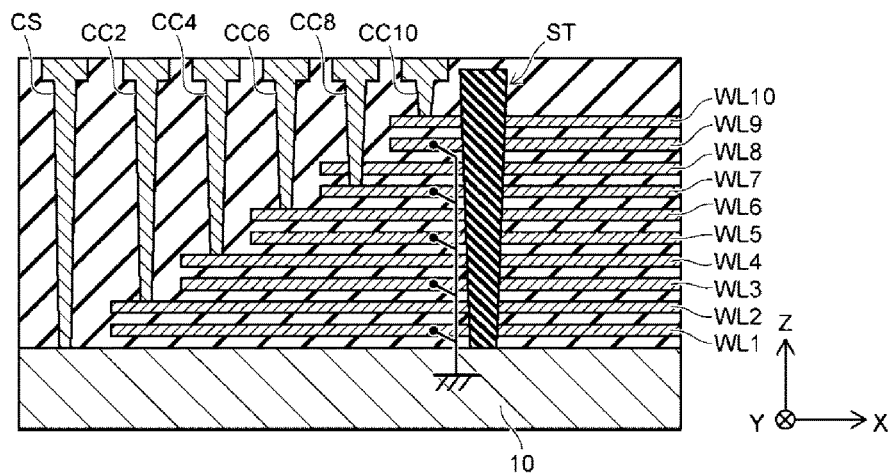
Figure 11D:
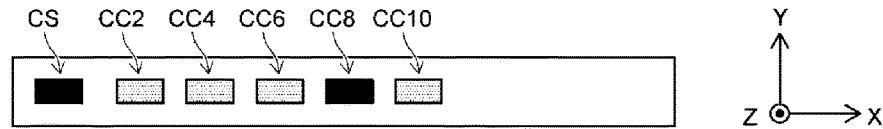

FIG. 11A to FIG. 11D are schematic views illustrating an example in which the contact plug CC is not correctly provided. FIG. 11A and FIG. 11C are cross-sectional views taken along line 10B-10B illustrated in FIG. 10A. FIG. 11B and FIG. 11D are schematic plan views illustrating luminance changes of the contact plugs CS and CC appearing in in-line inspection.

In the example illustrated in FIG. 11A, the contact plug CC6 is in contact with the end portions of the word lines WL7 and WL8. Such a defect occurs, for example, in a case where the condition for forming the end of each word line WL in a step shape is not correct.

FIG. 11B illustrates an example in a case where the contact plugs CS, CC2 to CC10 illustrated in FIG. 11A are irradiated with a charged particle beam and secondary electrons emitted from the vicinity of each of surfaces of the contact plugs CS, CC2 to CC10 are detected to thereby observe each of surfaces of the contact plugs. The contact plugs CC2, CC4 and CC10 are connected to the word lines WL2, WL4 and WL10 having a floating potential, respectively. For that reason, the contact plugs CC2, CC4, and CC10 are charged up to a negative potential by irradiation with the charged particle beam, and as a result, an amount of emitted secondary electrons is increased and, for example, relatively high luminance is exhibited compared with other contact plugs. It is assumed that relatively high luminance is exhibited by negative potential charge-up and relatively low luminance is exhibited by positive potential charge-up.

In contrast, the contact plug CS is connected to the source layer 10 and thus, the contact plug CS is not charged up to a negative potential by irradiation of the charged particle beam and exhibits relatively low luminance. The contact plug CC6 is in contact with the word line WL7 electrically connected to the source layer 10 and thus, exhibits relatively low luminance. Furthermore, the word line WL8 is electrically connected to the word line WL7 through the contact plug CC6 and thus, the contact plug CC8 connected to the word line WL8 also exhibits relatively low luminance.

When the contact plug CC6 is appropriately formed, the contact plugs CC6 and CC8 should exhibit relatively high luminance. As illustrated in FIG. 11B, however, luminance of the contact plugs CC6 and CC8 is low and thus, it is possible to detect matters that a defect is present in any of contact structures. With this, it is possible to modify a formation condition of the contact plug CC or the formation condition of end portions having a step shape of the word lines WL.

In an example illustrated in FIG. 11C, the contact plug CC8 penetrates through the word line WL8 and is in contact with the word line WL7. Such a defect occurs, for example, in a case where an etching amount of a contact hole for forming the contact plug CC is excessive.

FIG. 11D illustrates an example in a case where the contact plugs CS, CC2 to CC10 illustrated in FIG. 11A are irradiated with a charged particle beam and secondary electrons emitted from the vicinity of each of surfaces of the contact plugs are detected to thereby observe each of surfaces of the contact plugs. The contact plugs CC2, CC4, CC6 and CC10 are connected to the word lines WL2, WL4, WL6, and WL10 having a floating potential, respectively. For that treason, the contact plugs CC2, CC4, CC6 and CC10 exhibit relatively high luminance.

In contrast, the contact plug CC8 is in contact with the word line WL7 electrically connected to the source layer 10 and thus, the contact plug CSs exhibits relatively low luminance. When the contact plug CC8 is appropriately formed, the contact plug CC8 should exhibit relatively high luminance. Here, as illustrated in FIG. 11D, luminance of the contact plug CC8 is low and thus, it is possible to detect matters that the etching amount of the contact hole is excessive.

In a case where the etching amount of the contact hole is insufficient, the contact plug CS does not reach the source layer 10 and the contact plug CS has a floating potential. For that treason, the contact plug CS exhibits relatively high luminance as compared with a contact plug CS for which the etching amount is sufficiently normal. For that treason, it is possible to detect shortage of the etching amount of the contact hole by luminance of the contact plug CS.

Figure 12A:
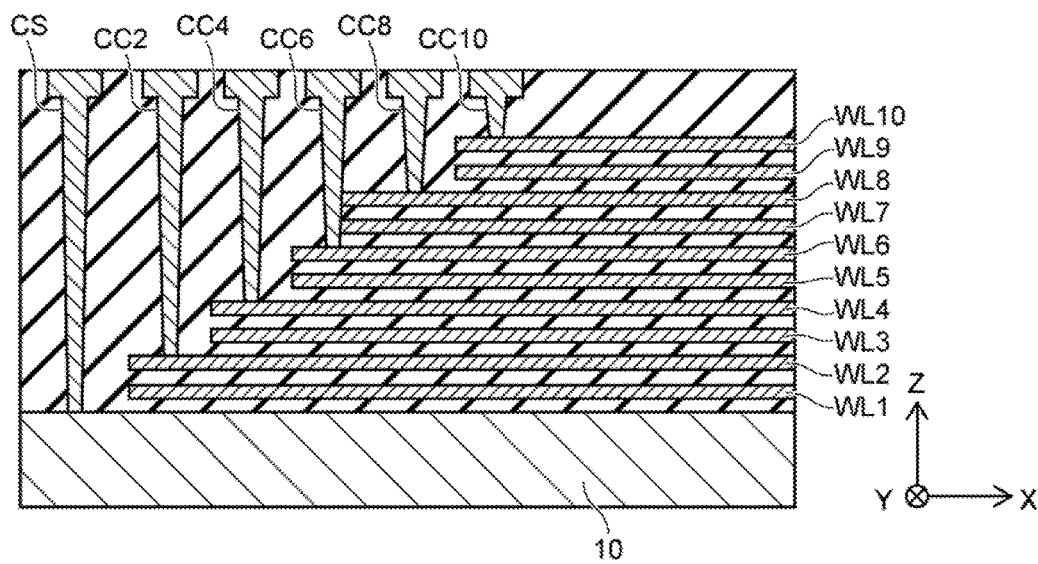
FIG. 12A and FIG. 12B are schematic diagrams illustrating an inspection method of a memory device according to a comparative example.
Figure 12B:
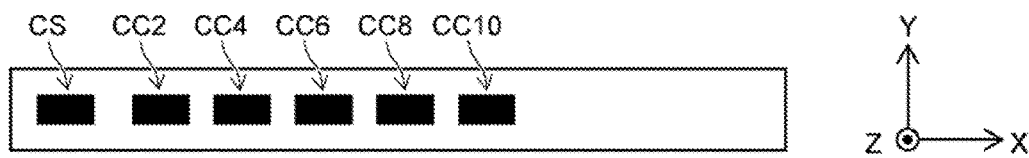

FIG. 12A and FIG. 12B are schematic diagrams illustrating in-line inspection according to a comparative example. In this example, the word lines WL1 to WL10 are not divided by the slit ST. For that reason, a parasitic capacitance between the word lines is large and in order to charge up the contact plug CC connected to each word line WL to a negative potential, irradiation with the charged up particle beam for a long time is required.

Accordingly, in order to detect abnormality of the contact plug CC6 illustrated in FIG. 10A, it is necessary to conduct in-line inspection for a long time and as a result, throughput of the manufacturing process is lowered. That is, in charged particle beam irradiation at a normal level, all the contact plugs CC exhibit low luminance as illustrated in FIG. 12B, and it is unable to detect connection failure of the contact plugs CC6 and CC8.

As described above, abnormality of the contact plug is detected by utilizing a fact that the amount of secondary electrons to be obtained by irradiating the charged particle beam depends on the potential of the contact plug to be irradiated. In some embodiments, the contact plug having a floating potential may be charged up to a positive potential or charged up to a negative potential, depending on the condition of energy and the current amount of the charged particle beam. That is, the embodiments of the present disclosure are not limited to the example described above in which the contact plug having the floating potential exhibits higher luminance than other contact plugs, and other embodiments are available as long as it is possible to detect a defect based on relative luminance change.

Figure 13:
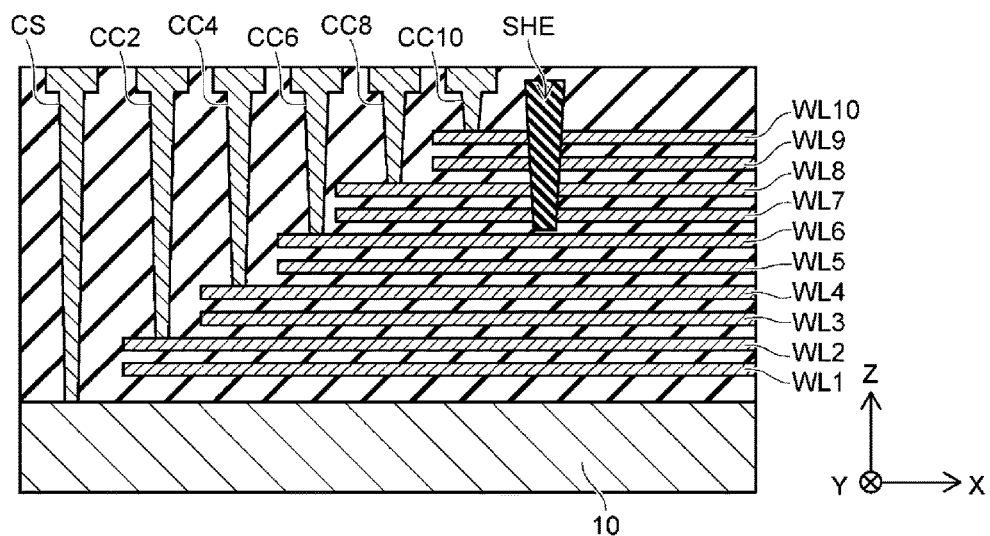
FIG. 13 is a schematic plan view illustrating a memory device according to a modification example of the second embodiment.

FIG. 13 is a schematic plan view illustrating an inspection region IR according to a modification example of the second embodiment. FIG. 13 is a schematic view corresponding to a cross section taken along line 10B-10B illustrated in FIG. 10A. In this example, a separation groove SHE is provided instead of the slit ST that divides all word lines WL1 to WL10.

As illustrated in FIG. 13, the separation groove SHE is provided so as to divide the word lines WL7 to WL10. For example, an insulating film such as a silicon oxide film may be embedded in the isolation trench SHE.

As described above, in a case where the etching amount of the contact hole for forming the contact plugs CS, CC1 to CC10 is insufficient, a contact hole forming the longest contact plug CS does not reach the source layer 10. For that reason, it is possible to detect shortage of the etching amount of the contact hole by observing luminance of the contact plug CS.

On the other hand, excessive of the etching amount of the contact hole is easily detected in the contact plugs CC8 and CC10 whose length in the Z-direction is short. That is, in a case where the etching amount becomes excessive, the contact holes for forming the contact plugs CC8 and CC10 may penetrate through the word lines WL8 and WL10 and reach the lower word lines WL7 and WL9. In this example, it is possible to reduce the parasitic capacitances of word lines WL8 and WL10 by providing the separation groove SHE. With this, it becomes possible to charge up the contact plugs CC8 and CC10 and it is possible to detect the presence of the contact hole penetrating through the word line WL8 or WL10.

Figure 14A:
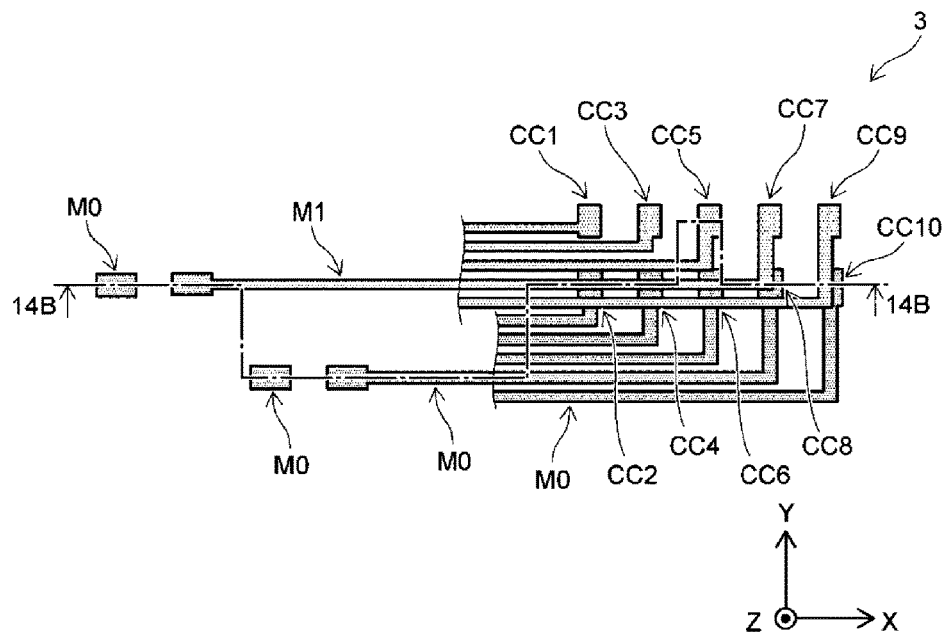
FIG. 14A and FIG. 14B are schematic diagrams illustrating a memory device according to a third embodiment.
Figure 14B:
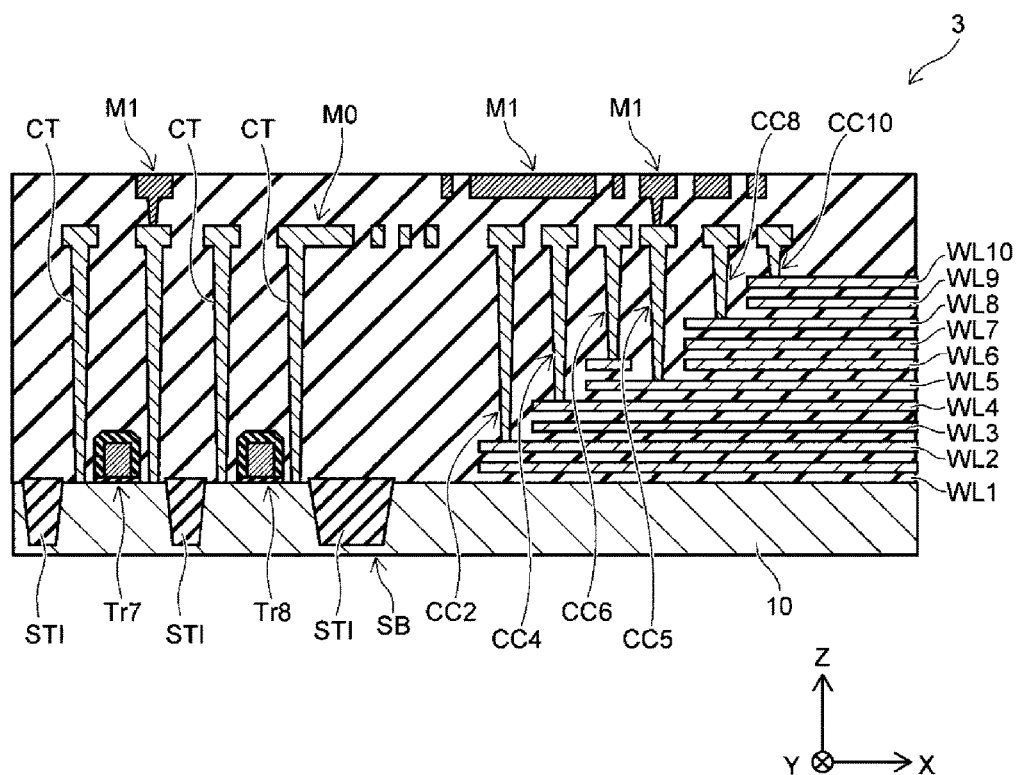

FIG. 14A and FIG. 14B are schematic diagrams illustrating a memory device 3 according to a third embodiment. FIG. 14A is a plan view illustrating the wirings M0 and M1 connecting the contact plugs CC1 to CC10 to the transistors Tr1 and Tr2. FIG. 14B is a cross-sectional view taken along line 14B-14B illustrated in FIG. 14A. In the third embodiment, the contact plugs CC1 to CC10 provided in the hook-up region HUR are electrically connected to the transistors Tr1 and Tr2 without providing the inspection region IR.

As illustrated in FIG. 14A, the contact plugs CC1 to CC10 are arranged in two aligned separate rows in the Y-direction. Thus, the contact plugs CC1, CC3, CC5 and CC7 are connected to the word lines WL1, WL3, WL5 and WL7, respectively (see FIG. 10C). The contact plugs CC2, CC4, CC6 and CC8 are connected to the word lines WL2, WL4, WL6 and WL8, respectively (see FIG. 10B).

For example, the contact plug CC7 is connected to a transistor Tr7 (see FIG. 14B) through a wiring M1. The contact plug CC8 is connected to a transistor Tr8 (see FIG. 14B) through the wiring M0.

As illustrated in FIG. 14B, the transistors Tr7 and Tr8 are provided on a substrate SB around the memory cell array MCA. For example, the transistor Tr8 and the memory cell array MCA may be electrically separated by shallow trench isolation (STI). The transistor Tr8 and the transistor Tr7 also may be electrically isolated by the STI. For example, the drain of the transistor Tr8 may be electrically connected to the word line WL8 through the contact plug CT, the wiring M0, and the contact plug CC8.

Figure 15:
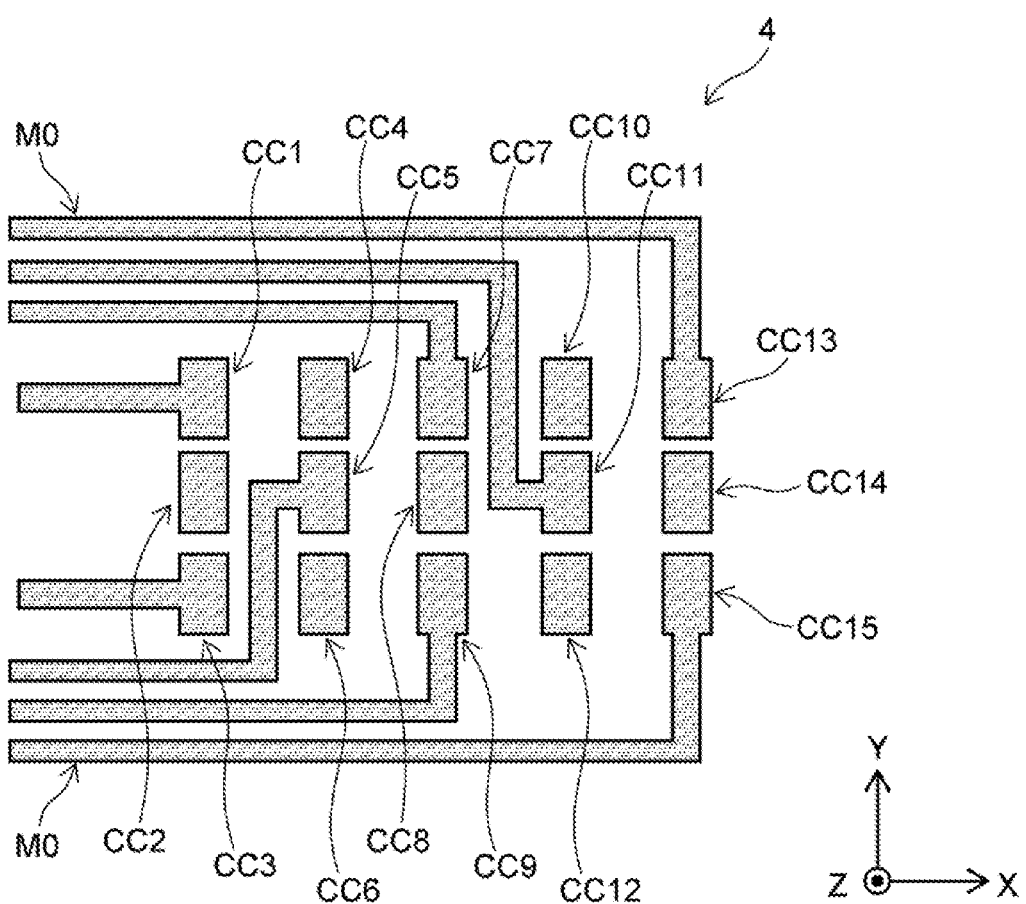
FIG. 15 is a schematic plan view illustrating the memory device according to the third embodiment.

FIG. 15 is a schematic plan view illustrating a memory device 4 according to the third embodiment. FIG. 15 is a plan view illustrating the M0 wiring electrically connecting the contact plugs CC1, CC3, CC5, CC7, CC9, and CC11 and the transistor Tr1.

As illustrated in FIG. 15, the contact plugs CC1 to CC15 are in three aligned rows in the Y-direction. The odd-numbered contact plugs CC are connected to different transistors through the wiring M0. The even-numbered contact plugs CC are connected to different transistors through the wiring M1 (not illustrated).

Figure 16A:
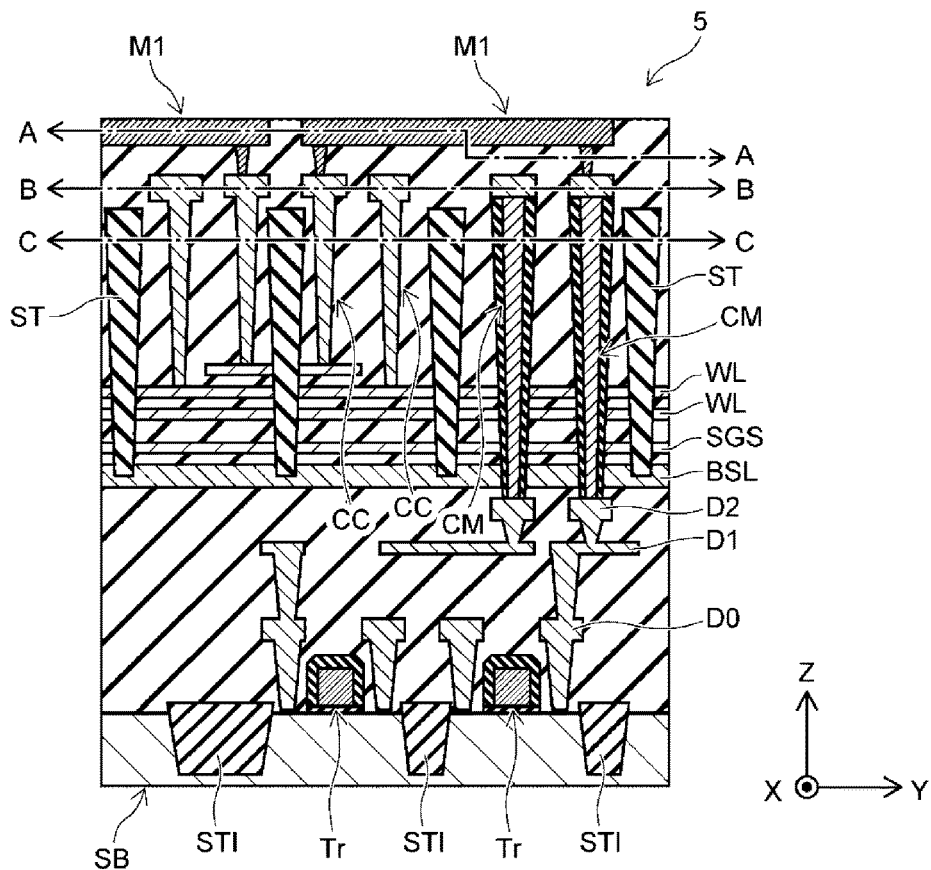
FIG. 16A and FIG. 16B are schematic diagrams illustrating a memory device according to a modification example of the third embodiment.
Figure 16B:
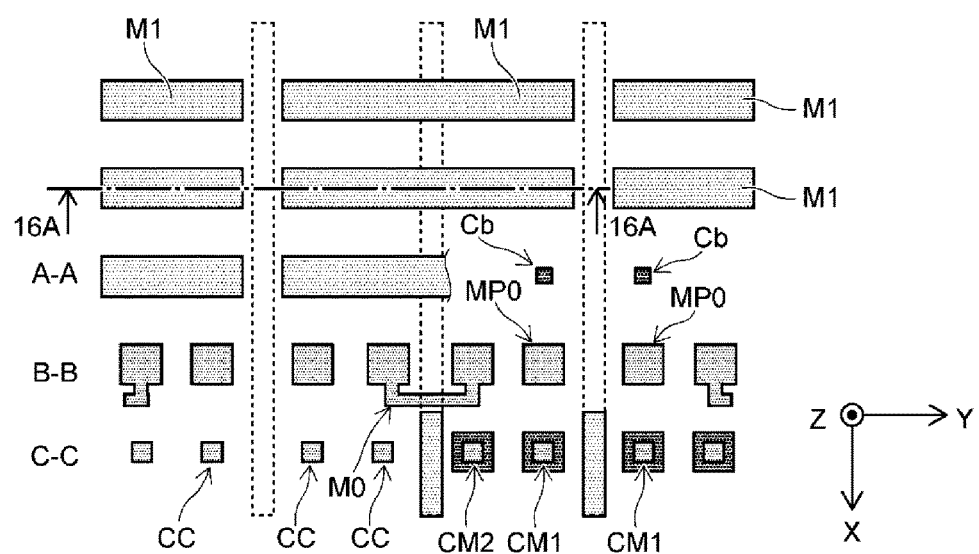

FIG. 16A and FIG. 16B are schematic diagrams illustrating a memory device 5 according to a modification example of the third embodiment. FIG. 16A is a cross-sectional view taken along line 16A-16A illustrated in FIG. 16B. FIG. 16B is a plan view including cross sections taken along lines A-A, B-B, and C-C illustrated in FIG. 16A and illustrates a connection relationship between the wirings M0 and M1 and the contact plugs CC and CM.

As illustrated in FIG. 16A, the memory device 5 includes a plurality of transistors Tr disposed on the substrate SB and a source line BSL. The source line BSL is provided above the plurality of transistors Tr, and a wiring layer including wirings D0, D1 and D2 is provided between the source line BSL and the substrate SB. The selection gate SGS and the word line WL are stacked on the source line BSL. Furthermore, the wirings M0 and M1 are provided above the word line WL.

The word line WL is electrically connected to the transistor Tr disposed below the memory cell array MCA through the contact plug CC, the wiring M0 or M1, the contact plug CM, and the wirings D2, D1 and D0. The contact plug CM may penetrate through the selection gate SGD (not illustrated), the plurality of word lines WL, the selection gate SGS, and the source line BSL and is connected to the wiring D2.

As illustrated in the A-A cross section in FIG. 16B, the wiring M1 is connected to a pad MP0 provided at the level of the wiring M0 through the contact plug Cb. Furthermore, as illustrated in the B-B cross section and the C-C cross section in FIG. 16B, the contact plug Cb is connected to a contact plug CM1 through the pad MP0. A contact plug CM2 is connected to the contact plug CC through the wiring M0.

As described above, the transistor Tr may be disposed below the memory cell array MCA to be connected to the word line WL through the contact plug CM which penetrates through the memory cell array MCA and extends in the Z-direction.

Figure 17A:
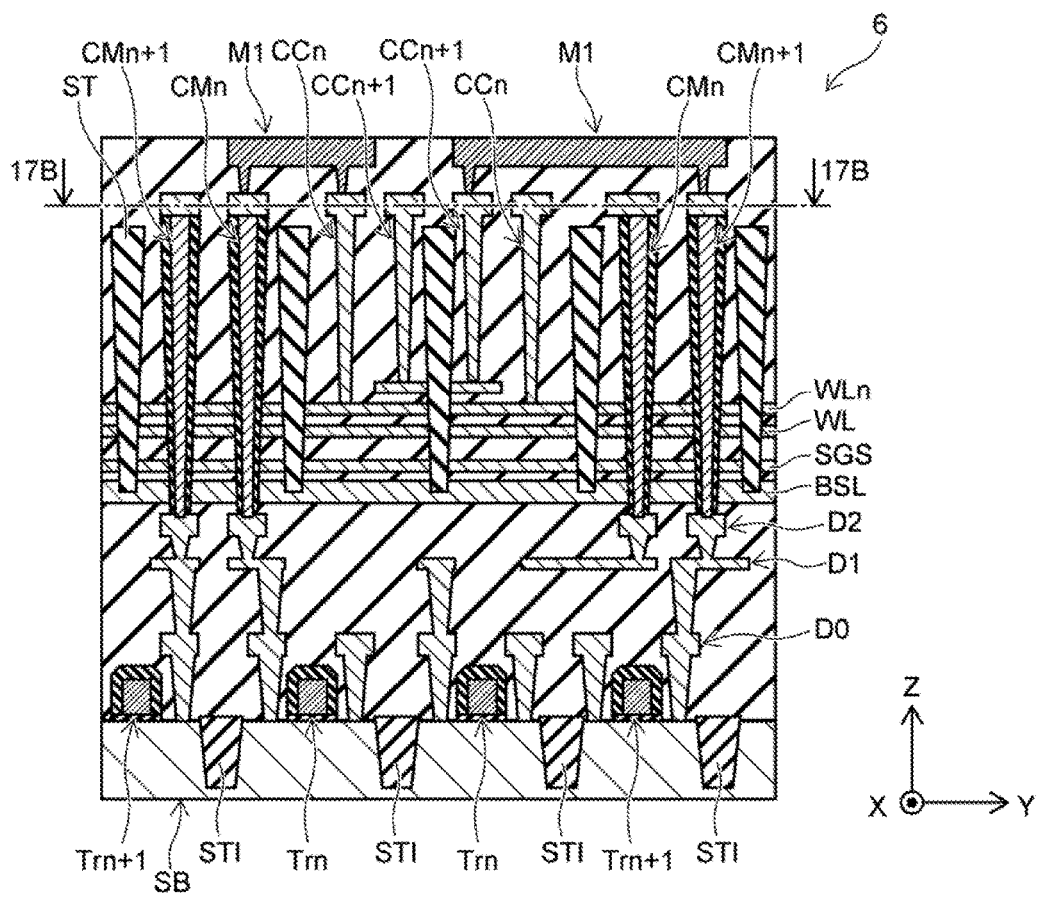
FIG. 17A and FIG. 17B are other schematic diagrams illustrating the memory device according to the modification example of the third embodiment.
Figure 17B:
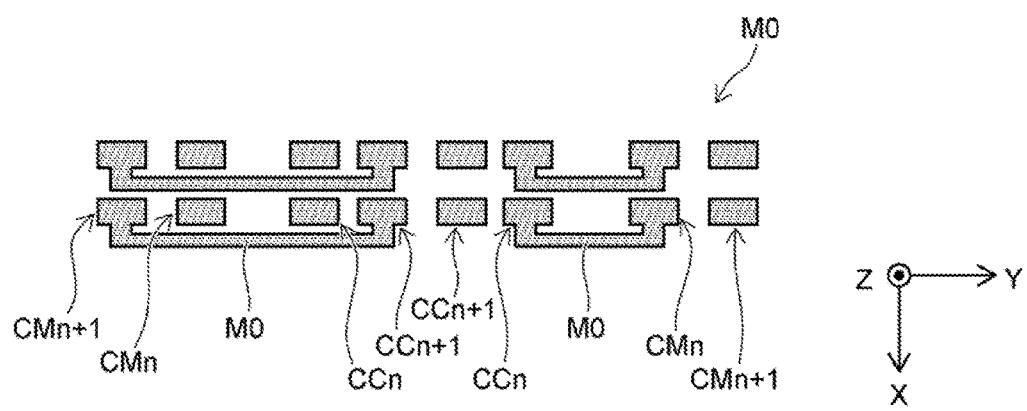

FIG. 17A and FIG. 17B are schematic diagrams illustrating a memory device 6 according to another modification example of the third embodiment. FIG. 17A is a cross-sectional view of the memory cell array MCA of the memory device 6. FIG. 17B is a cross-sectional view taken along line 17B-17B illustrated in FIG. 17A and illustrates the wiring M0.

As illustrated in FIG. 17A, for example, each one word line WLn stacked at the nth position is electrically connected to a transistor Trn through a contact plug CCn, the wiring M0, a contact plug CMn, and the wirings D2, D1, and D0. As illustrated in FIG. 17B, the contact plug CCn and the contact plug CMn are electrically connected through the wiring M0.

Furthermore, the (n+1)th word line WLn+1 stacked thereabove is electrically connected to a transistor Trn+1 through a contact plug CCn+1, the wiring M1, a contact plug CMn+1 and the wirings D2, D1 and D0.

As described above, it is also possible to provide the word lines Wn and Wh+1 so that the even-numbered word line WLn is connected to the transistor Trn and the odd-numbered word line WLn+1 is connected to the transistor Trn+1 (see FIG. 5). The transistor Tr illustrated here may function as a switching transistor for applying a potential to the word line WL.

For example, when the connection between the word line WL and the substrate through the transistor Tr is configured to use at least two layers of stacked wirings, it is possible to connect even-numbered word lines WLn to the substrate using the wiring of a first layer (e.g., wiring M0) and connect the odd-numbered word lines WLn+1 to the substrate using the wiring of a second layer (e.g., wiring M1). In this case, the wiring of the second layer is not formed at the time of forming the wiring of the first layer and thus, the odd-numbered word line WLn+1 is not connected to the substrate and has a floating potential. With this, the connection of the word line WL illustrated in FIG. 11A and FIG. 11B is implemented and it becomes possible to detect abnormality of the contact plug CC. The embodiments of the present disclosure are not limited to this. For example, the word line WL connected to the substrate through the wiring M0 of the first layer and the transistor Tr connected to the wiring M0 of the first layer is either an odd numbered word line or an even numbered word line and otherwise, an arbitrary word line WL can be selected.

While certain embodiments have been described, these embodiments have been presented byway of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory device comprising:
   a plurality of elements that include three-dimensional arranged memory cells;
   a transistor electrically connected to at least one of the plurality of elements;
   an inspection pad electrically connected in series to at least one of the plurality of elements through the transistor; and
   a wiring electrically connected to the inspection pad and to a gate of the transistor and capable of supplying a common potential to both the inspection pad and the transistor for turning the transistor to an OFF state,
   wherein the wiring is provided in a wiring layer that is a different layer than the inspection pad in a stacking direction of a plurality of word lines of the three-dimensional arranged memory cells.

2. The memory device according to claim 1,
   wherein the inspection pad is provided in a wiring layer that is a different layer than the plurality of elements in the stacking direction of the plurality of word lines of the three-dimensional arranged memory cells.

3. The memory device according to claim 1, further comprising:
   a substrate on which the plurality of elements are provided,
   wherein the inspection pad and the gate of the transistor are electrically connected to the substrate through the wiring.

4. The memory device according to claim 1, further comprising:
   a gate pad provided in a wiring layer in which the inspection pad is provided, and connected to the gate of the transistor,
   wherein the wiring is electrically connected to the gate pad.

5. A manufacturing method for forming a memory device, the method comprising:
   forming a plurality of elements that include three-dimensional arranged memory cells, a transistor electrically connected to at least one of the plurality of elements, and an inspection pad connected in series to at least one of the plurality of elements through the transistor;
   turning the transistor to an ON state and inspecting the presence or absence of electrical connection or current-voltage characteristics between the at least one of the plurality of elements and at least one other element through the inspection pad;
   forming a wiring electrically connected to the inspection pad and a gate of the transistor, and turning the transistor to an OFF state by supplying a predetermined bias to the inspection pad and the gate of the transistor through the wiring and inspecting a memory cell, wherein the wiring is formed in a wiring layer that is a different layer than the inspection pad in a stacking direction of a plurality of word lines of the three-dimensional arranged memory cells.

6. The manufacturing method according to claim 5, wherein the inspection pad is formed in a wiring layer that is a different layer than the plurality of elements in the stacking direction of the plurality of word lines of the three-dimensional arranged memory cells.

7. The manufacturing method according to claim 5, further comprising:
forming a substrate on which the plurality of elements are provided; and
electrically connecting the inspection pad and the gate of the transistor to the substrate through the wiring.

8. The manufacturing method according to claim 5, further comprising:
forming a gate pad in a wiring layer in which the inspection pad is formed; and
connecting the gate pad to the gate of the transistor,
wherein the wiring is electrically connected to the gate pad.

9. A memory device comprising:
a first stacked body including a plurality of first electrode layers that extend in a first direction and are stacked in a second direction intersecting the first direction; and
a semiconductor pillar extending through the plurality of first electrode layers in the second direction,
wherein the plurality of first electrode layers include a plurality of first layers and a plurality of second layers located between the first layers in the second direction,
the plurality of first layers are electrically connected to a substrate through a common first conductor, the first conductor being located above the first stacked body in the second direction, and
at least one of the plurality of second layers is electrically connected to a second conductor, the second conductor being electrically insulated from the first conductor.

10. The memory device according to claim 9,
wherein the first stacked body includes a first region having the semiconductor pillar, a second region in which the first layers and the first conductor are connected to each other, and an insulator which is provided between the first region and the second region,
the first region and the second region are electrically insulated by the insulator.

11. The memory device according to claim 10,
wherein the second region is located in the first direction when viewed from the first region.

12. The memory device according to claim 9,
wherein the plurality of second layers are electrically connected to respective second conductors each electrically insulated from the first conductor, the respective second conductors being electrically insulated with each other.

13. The memory device according to claim 12, further comprising:
a plurality of first contact plugs and second contact plugs, each of the first contact plugs being to be connected between one of the plurality of first layers of the first electrode layers and the first conductor, and each of the second contact plugs being to be connected between one of the plurality of second layers of the first electrode layers and one of the respective second conductors.

14. The memory device according to claim 9,
wherein the second conductor is provided at a same position as the first conductor in the second direction.

15. The memory device according to claim 9,
wherein the first electrode layers function as word lines of a memory cell array and the semiconductor pillar forms memory cells at intersections with the first electrode layers functioning as word lines.

* * * * *